(12) United States Patent
Ban et al.

(10) Patent No.: US 10,807,198 B2
(45) Date of Patent: Oct. 20, 2020

(54) LASER PROCESSING APPARATUS

(71) Applicant: DISCO CORPORATION, Tokyo (JP)

(72) Inventors: Yuri Ban, Tokyo (JP); Yuta Yoshida, Tokyo (JP); Kentaro Odanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 343 days.

(21) Appl. No.: 15/880,846

(22) Filed: Jan. 26, 2018

(65) Prior Publication Data

US 2018/0214986 A1  Aug. 2, 2018

(30) Foreign Application Priority Data

Jan. 27, 2017  (JP) .................................. 2017-013501

(51) Int. Cl.

| | | |
|---|---|---|
| *B23K 26/364* | (2014.01) | |
| *H01L 21/67* | (2006.01) | |
| *H01L 21/66* | (2006.01) | |
| *B23K 26/03* | (2006.01) | |
| *H01L 21/78* | (2006.01) | |
| *B23K 103/00* | (2006.01) | |
| *H01L 21/56* | (2006.01) | |
| *H01L 21/683* | (2006.01) | |
| *H01L 23/31* | (2006.01) | |

(52) U.S. Cl.
CPC .......... *B23K 26/364* (2015.10); *B23K 26/032* (2013.01); *H01L 21/67092* (2013.01); *H01L 21/67253* (2013.01); *H01L 21/67288* (2013.01); *H01L 21/78* (2013.01); *H01L 22/12* (2013.01); *H01L 22/20* (2013.01); *B23K 2103/56* (2018.08); *H01L 21/561* (2013.01); *H01L 21/6838* (2013.01); *H01L 23/3178* (2013.01)

(58) Field of Classification Search
CPC ......... H01L 21/67092; H01L 21/67253; H01L 21/67288; H01L 21/2838; H01L 21/48; H01L 22/12; H01L 22/20; B23K 2103/56; B23K 2103/50; B23K 26/364; B23K 26/302
See application file for complete search history.

(56) References Cited

U.S. PATENT DOCUMENTS

| | | | | |
|---|---|---|---|---|
| 7,655,541 B2 * | 2/2010 | Oba | ....................... | B23K 26/03 438/463 |
| 8,654,191 B2 * | 2/2014 | Nakamura | ......... | G01N 21/3563 348/87 |

FOREIGN PATENT DOCUMENTS

JP  2002-100709 A  4/2002

* cited by examiner

*Primary Examiner* — Erin Deery
(74) *Attorney, Agent, or Firm* — Greer Burns & Crain Ltd.

(57) ABSTRACT

A laser processing apparatus includes: a chuck table that holds a packaged wafer by a holding surface; a laser processing unit that applies a laser beam to the packaged wafer to form a through-groove along each division line; an X-axis moving unit that moves the chuck table in an X-axis direction; and an examination unit. The chuck table includes: a holding member that forms the holding surface; and a light emitting body. The examination unit includes: a line sensor that extends in a Y-axis direction; and a control unit that determines the result of processing through reception by the line sensor of light from the light emitting body through the through-groove. The line sensor images the whole surface of the packaged wafer being held by the chuck table.

2 Claims, 15 Drawing Sheets

LASER PROCESSING APPARATUS

BACKGROUND OF THE INVENTION

Field of the Invention

The present invention relates to a laser processing apparatus.

Description of the Related Art

As a processing method for dividing a semiconductor wafer into individual device chips, there have been known cutting by a cutting blade and ablation by application of a pulsed laser beam. In general, each of the individually divided device chips is fixed to a mother substrate or the like, is wired by wires or the like, and is packaged with a molding resin. However, due to a minute crack in a side surface of the device chip or the like, when the device chip is used for a long time, the crack may expand, leading to breakage of the device chip. In order to restrain such breakage of the device chip, a packaging technique of covering side surfaces of the device chip with a molding resin to thereby prevent external environmental factors from influencing the device chip has been developed (see, for example, Japanese Patent Laid-open No. 2002-100709).

In the packaging technique disclosed in Japanese Patent Laid-open No. 2002-100709, first, grooves are formed along division lines (streets) on the wafer from the front side of the wafer, and a molding resin is placed to fill the grooves and cover the wafer surface. Thereafter, in the packaging technique of Japanese Patent Laid-open No. 2002-100709, the wafer is thinned from the back side until the molding resin in the grooves is exposed, to thereby divide the devices on the wafer. Finally, in the packaging technique of Japanese Patent Laid-open No. 2002-100709, the molding resin in the grooves is divided from the front side of the wafer, to thereby divide the wafer into the individual device chips. In the above-mentioned packaging technique, use of ablation by applying a pulsed laser beam, instead of cutting, for dividing the wafer into the device chips has been developed. The use of ablation is beneficial because it makes it possible to make extremely narrow the cutting allowance used for division between the device chips, to design the division lines in a very thin form, and thereby to increase the number of device chips obtained by wafer.

SUMMARY OF THE INVENTION

The ablation by application of a pulsed laser beam is a processing method in which, for forming very narrow grooves in the molding resin, a pulsed laser beam is scanned multiple times to gradually deepen the narrow grooves. In the ablation by application of a pulsed laser beam, the processing is conducted with a minimum number of times of scanning of the pulsed laser beam, for shortening the processing time. Therefore, when there is a part where the molding resin is abruptly thicker, the molding resin at the part cannot be removed and, hence, a through-groove cannot be formed properly, so that a blind hole state would be generated. Accordingly, in the processing method of the related art, the operator checks the wafers one by one after the ablation, and discards the region with the through-groove in a blind hole state as a defective chip. Thus, in the processing method of the related art, it has been impossible to properly form the through-grooves along all the division lines of the workpiece while restraining the processing time from being prolonged.

It is therefore an object of the present invention to provide a laser processing apparatus by which it is possible to properly form through-grooves along all division lines of a workpiece.

In accordance with an aspect of the present invention, there is provided a laser processing apparatus including: a chuck table that holds a workpiece by a holding surface; a laser processing unit that applies a laser beam of such a wavelength as to be absorbed in the workpiece to the workpiece held by the chuck table, to form a through-groove along each of division lines; a processing feeding unit that moves the chuck table in a processing feed direction parallel to the holding surface; and an examination unit that examines the through-grooves of the workpiece held by the chuck table. The chuck table includes a transparent or semi-transparent holding member that forms the holding surface, and a light emitting body that illuminates the workpiece through the holding member on the side of a surface opposite to the holding surface of the holding member. The examination unit includes a line sensor that extends along a surface direction of the holding surface in a direction orthogonal to the processing feed direction, faces the holding surface and receives light from the light emitting body, and a determination section that determines a result of processing through reception by the line sensor of the light from the light emitting body through the through-groove. The liner sensor images a whole surface of the workpiece having been formed with the through-grooves and being held by the chuck table.

In the aforementioned aspect of the present invention, when it is determined by the determination section that the result of processing of the through-groove is bad, the laser beam may be applied to the workpiece in a region where the processing result is determined to be bad, to process the workpiece in the region.

The laser processing apparatus according to the described aspect of the present invention has an effect that through-grooves can be properly formed along all the division lines of a workpiece.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
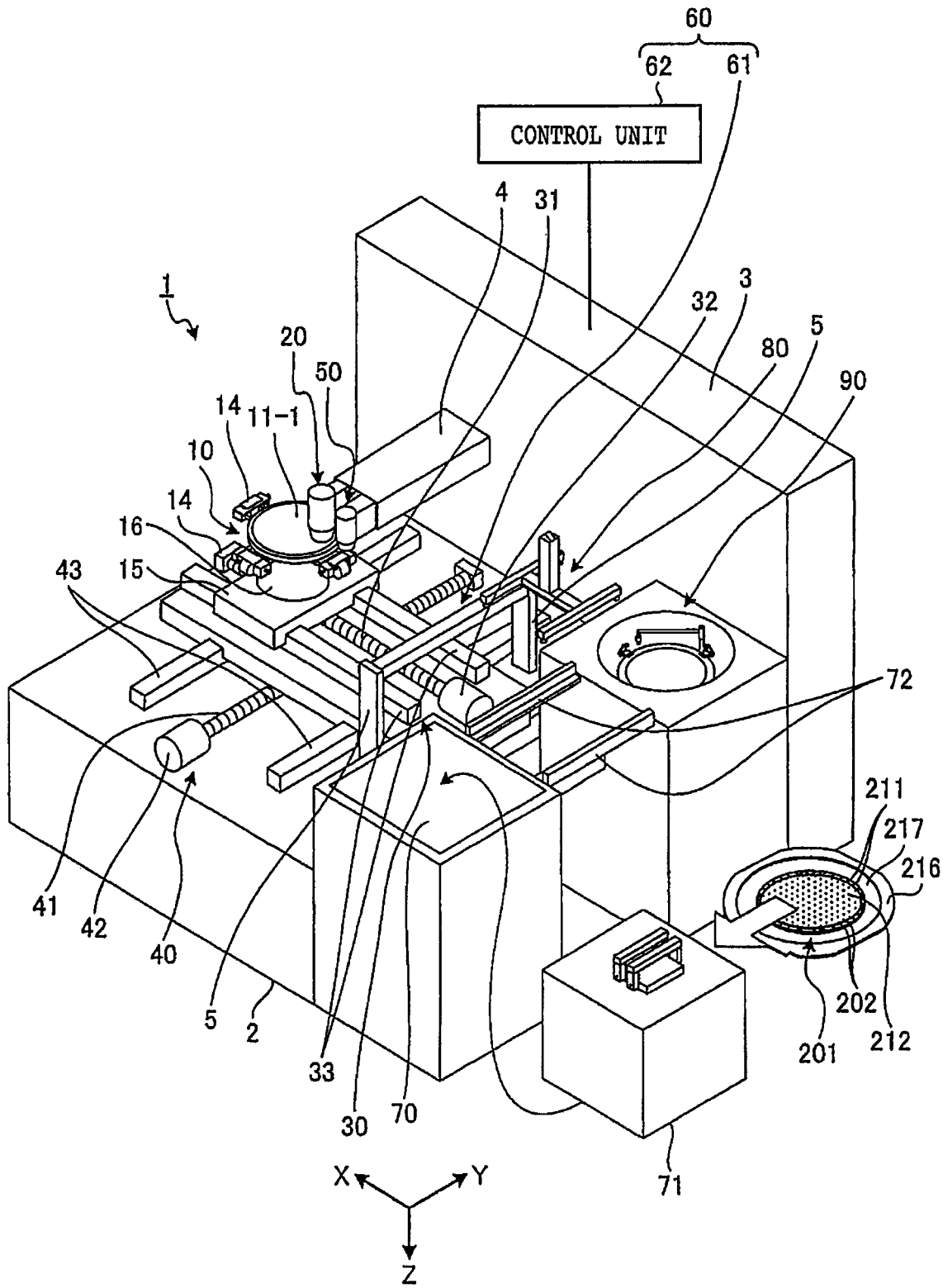
FIG. 1 is a perspective view depicting schematically a configuration example of a laser processing apparatus according to Embodiment 1.

Modes (Embodiments) of carrying out the present invention will be described in detail below, referring to the drawings. The present invention is not to be restricted by the description of the embodiments as follows. In addition, the constituent elements described below include the ones which can be easily conceived by those skilled in the art and substantial equivalents of them. Further, the configurations described below can be combined as required. In addition, various omissions, replacements and modifications can be made as to the configurations without departing from the gist of the present invention.

Embodiment 1

Figure 2A:
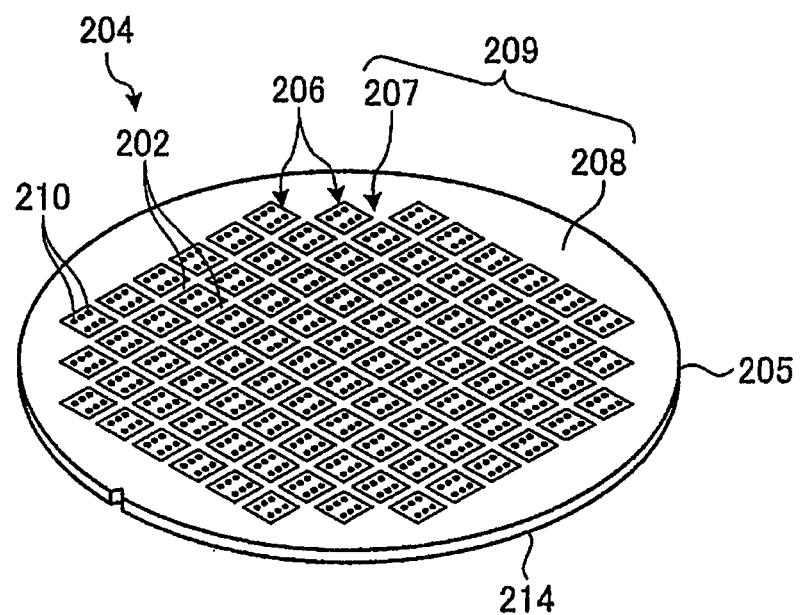
FIG. 2A is a perspective view of a wafer constituting a packaged wafer as an object to be processed by the laser processing apparatus according to Embodiment 1.
Figure 2B:
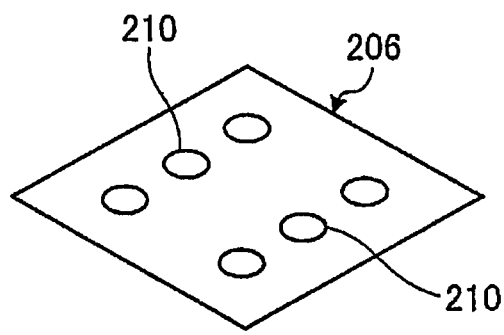
FIG. 2B is a perspective view of a device of the wafer depicted in FIG. 2A.
Figure 3:
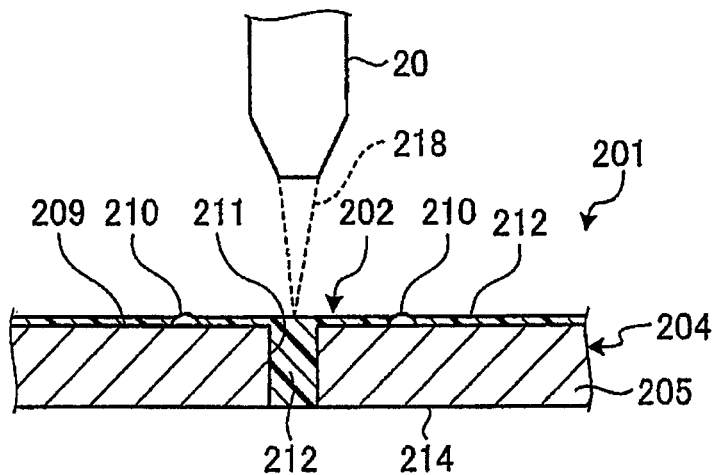
FIG. 3 is a sectional view of a major part of the packaged wafer as the object to be processed by the laser processing apparatus according to Embodiment 1.
Figure 4:
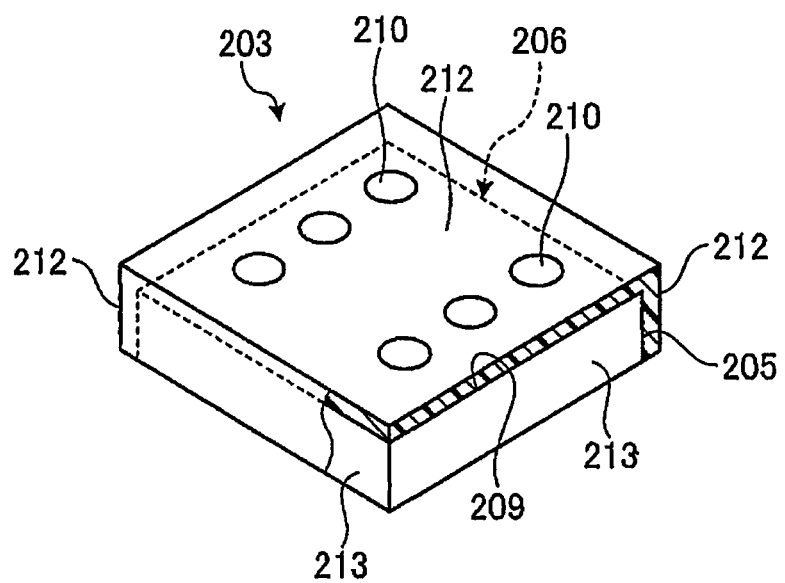
FIG. 4 is a perspective view depicting a packaged device chip obtained by dividing the packaged wafer depicted in FIG. 3.

A laser processing apparatus according to Embodiment 1 will be described. FIG. 1 is a perspective view depicting schematically a configuration example of the laser processing apparatus according to Embodiment 1. FIG. 2A is a perspective view of a wafer constituting a packaged wafer as an object to be processed by the laser processing apparatus according to Embodiment 1. FIG. 2B is a perspective view of a device of the wafer depicted in FIG. 2A. FIG. 3 is a sectional view of a major part of the packaged wafer as the object to be processed by the laser processing apparatus according to Embodiment 1. FIG. 4 is a perspective view depicting a packaged device chip obtained by dividing the packaged wafer depicted in FIG. 3.

The laser processing apparatus 1 depicted in FIG. 1 according to Embodiment 1 is an apparatus for applying ablation to division lines 202 of a packaged wafer 201 depicted in FIG. 3 as a workpiece, thereby dividing the packaged wafer 201 into packaged device chips 203 depicted in FIG. 4. The packaged wafer 201 as an object to be processed by the laser processing apparatus 1 according to Embodiment 1 is composed of a wafer 204 depicted in FIG. 2A. The wafer 204 depicted in FIG. 2A is, in Embodiment 1, a circular disk-shaped semiconductor wafer or optical device wafer including a substrate 205 formed of silicon, sapphire, gallium arsenide or the like. As depicted in FIG. 2A, the wafer 204 is provided on its front surface 209 with a device region 207 in which devices 206 are formed respectively in a plurality of regions partitioned by a plurality of intersecting (in Embodiment 1, orthogonally intersecting or crossing) division lines (streets) 202, and a peripheral marginal region 208 surrounding the device region 207. A plurality of bumps 210 which are projecting electrodes are formed on the surface of the device 206, as depicted in FIG. 2B.

As illustrated in FIG. 3, the wafer 204 is configured as the packaged wafer 201 in which the front surface 209 of the device region 207 and grooves 211, which are processed regions formed at the division lines 202 along the division lines 202, are covered with a molding resin 212. Specifically, in the packaged wafer 201, the molding resin 212 is placed to cover the upper side of the devices 206 provided on the front surface 209 of the substrate 205 and to fill the grooves 211 between the devices 206. The packaged wafer 201 is divided at the grooves 211 formed along the division lines 202, into the packaged device chips 203 depicted in FIG. 4. The packaged device chip 203 is in a state in which the upper side of the device 206 provided on the front surface 209 of the substrate 205 and all side surfaces 213 are covered with the molding resin 212, whereas the bumps 210 are protruding from the molding resin 212 and are exposed.

Note that in Embodiment 1, the width of the grooves 211 in the packaged wafer 201 is narrower than the width of the division lines 202, and is, for example, 20 μm. In Embodiment 1, the thickness (referred to also as finished thickness) of the packaged wafer 201 is larger than the thickness of the semiconductor wafer to be divided into devices, and is, for example, 300 μm. In Embodiment 1, the plan-view shape of the packaged device chip 203 is larger than that of the device divided from the semiconductor wafer by use of a cutting blade, and is formed in a square shape with each side being 3 mm, for example.

Figure 5:
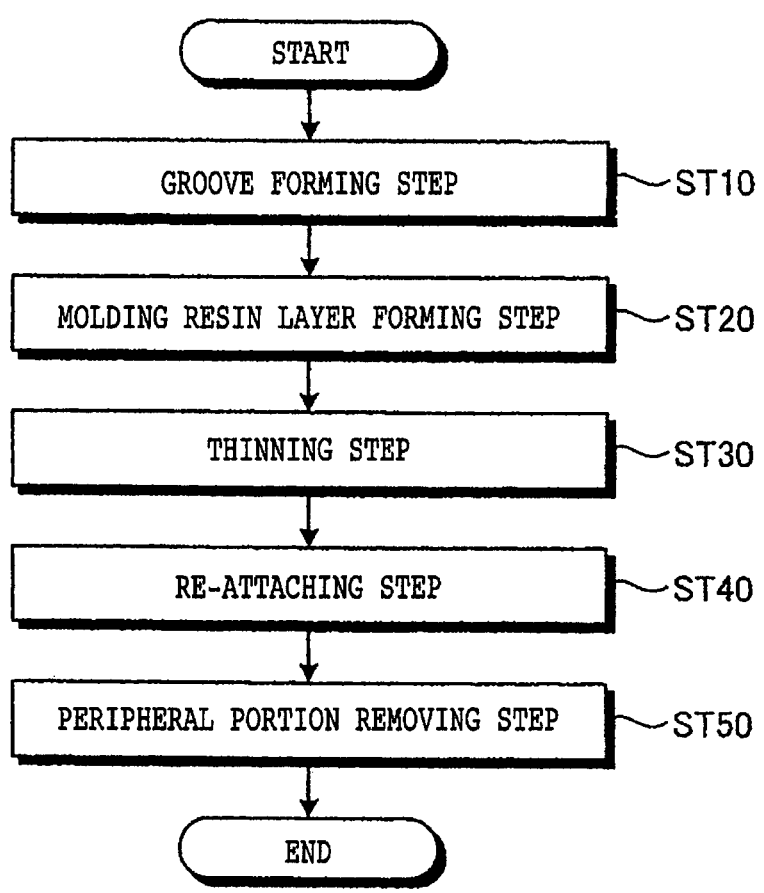
FIG. 5 is a flow chart depicting the flow of a method of manufacturing the packaged wafer as the object to be processed by the laser processing apparatus depicted in FIG. 1.
Figure 6A:
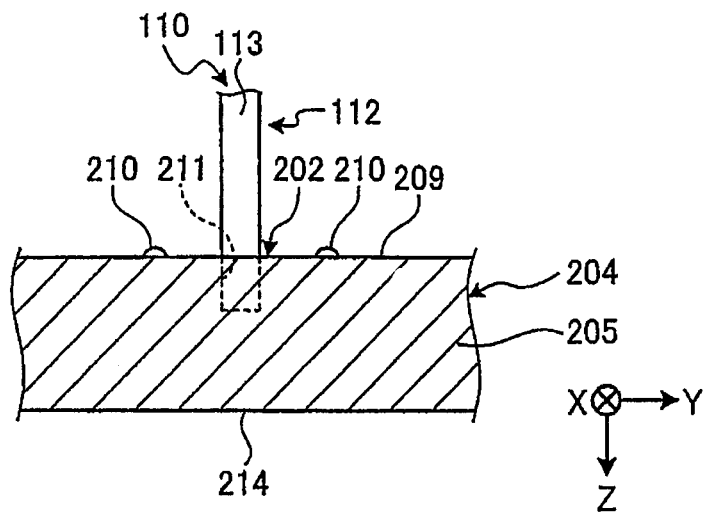
FIG. 6A is a sectional view of a major part of a wafer during a groove forming step in the method of manufacturing the packaged wafer depicted in FIG. 5.
Figure 6B:
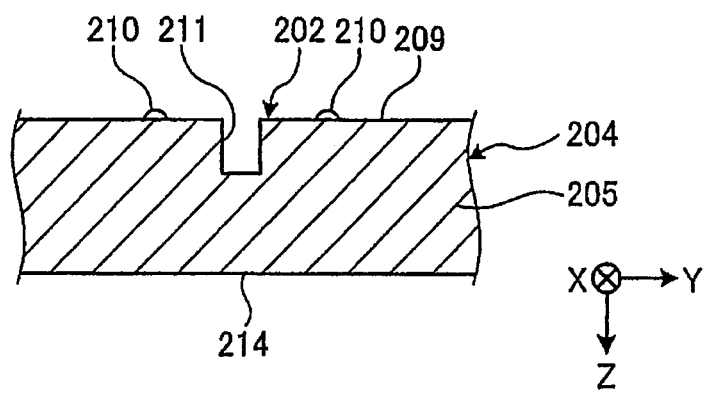
FIG. 6B is a sectional view of a major part of the wafer after the groove forming step in the method of manufacturing the packaged wafer depicted in FIG. 5.
Figure 6C:
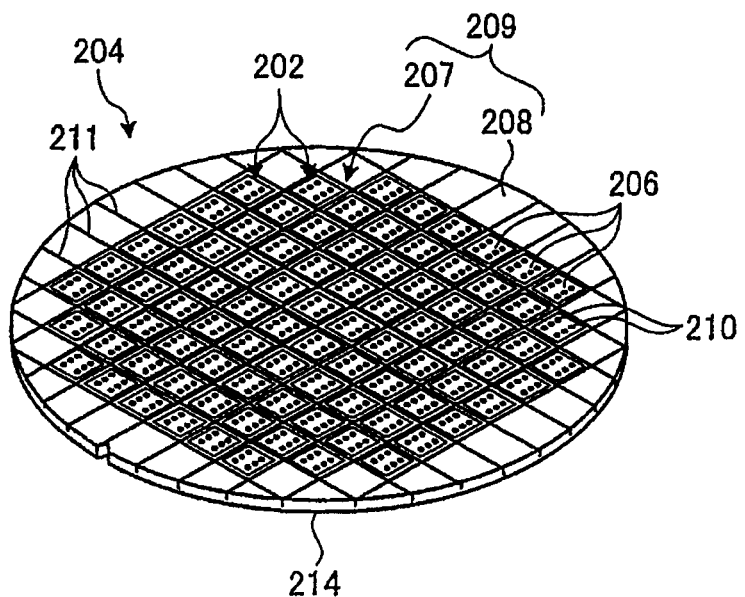
FIG. 6C is a perspective view of the wafer after the groove forming step in the method of manufacturing the packaged wafer depicted in FIG. 5.
Figure 7:
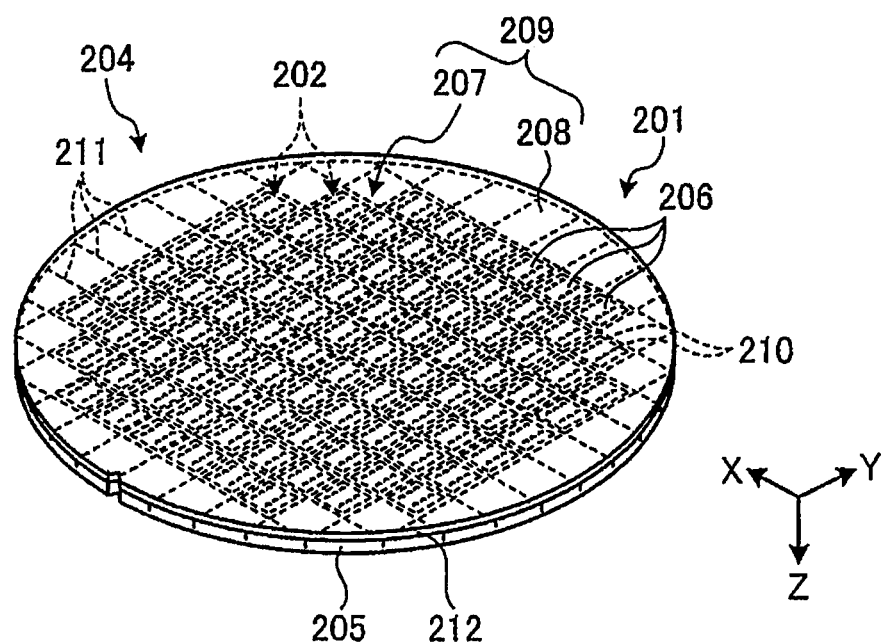
FIG. 7 is a perspective view of the packaged wafer after a molding resin layer forming step in the method of manufacturing the packaged wafer depicted in FIG. 5.
Figure 8:
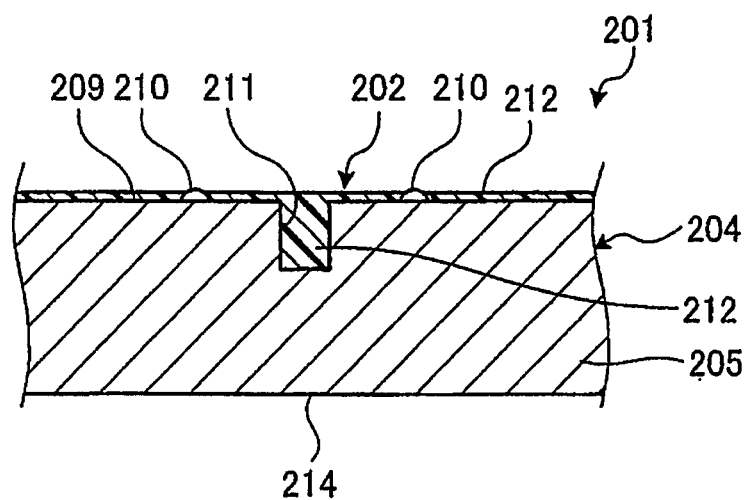
FIG. 8 is a sectional view of a major part of the packaged wafer after the molding resin layer forming step in the method of manufacturing the packaged wafer depicted in FIG. 5.
Figure 9A:
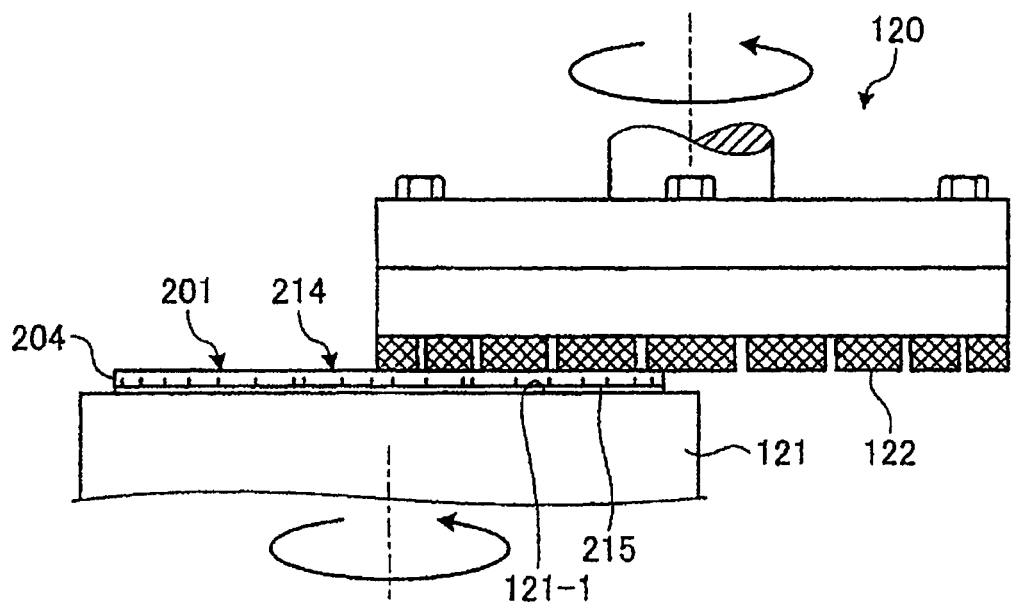
FIG. 9A is a side view depicting a thinning step in the method of manufacturing the packaged wafer depicted in FIG. 5.
Figure 9B:
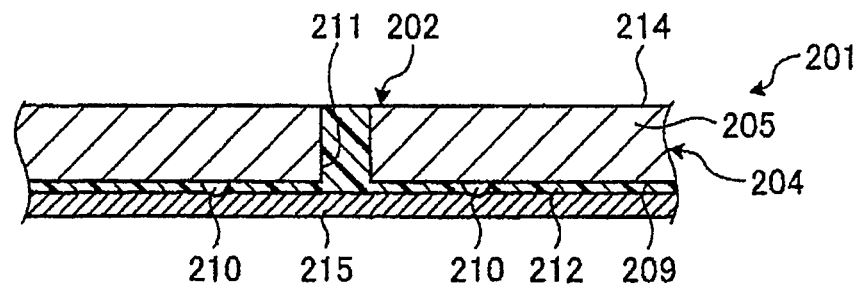
FIG. 9B is a sectional view of the packaged wafer after the thinning step in the method of manufacturing the packaged wafer depicted in FIG. 5.
Figure 10:
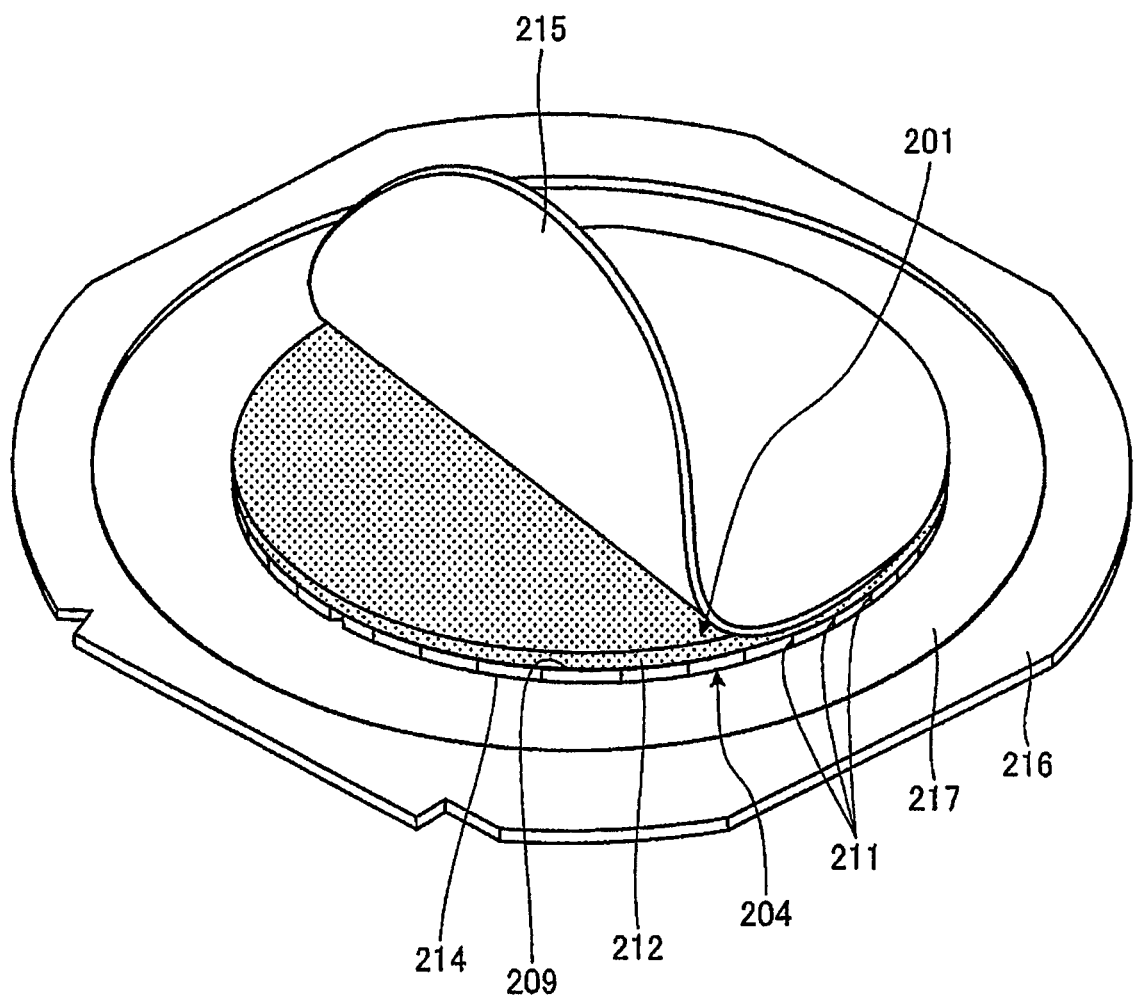
FIG. 10 is a perspective view depicting a re-attaching step in the method of manufacturing the packaged wafer depicted in FIG. 5.
Figure 11A:
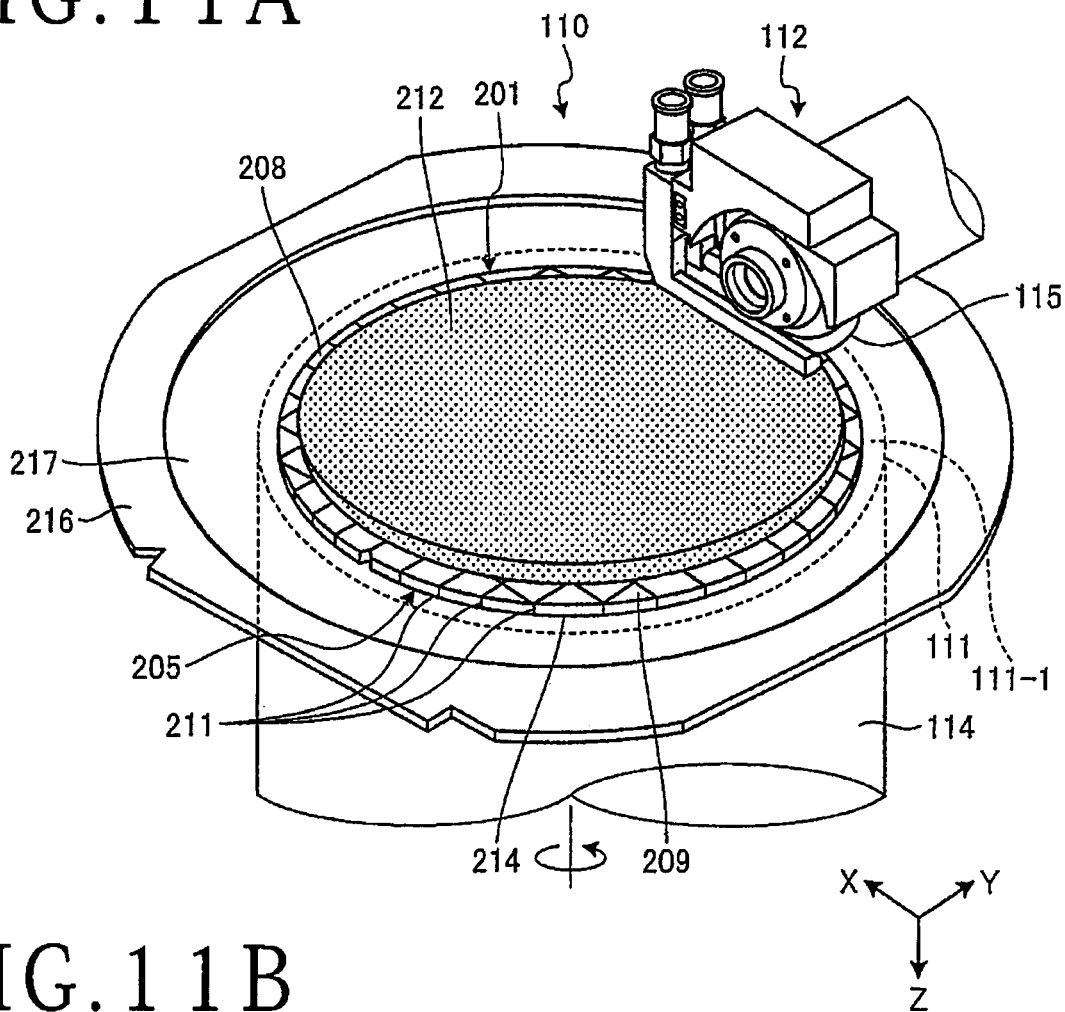
FIG. 11A is a perspective view depicting a peripheral portion removing step in the method of manufacturing the packaged wafer depicted in FIG. 5.
Figure 11B:
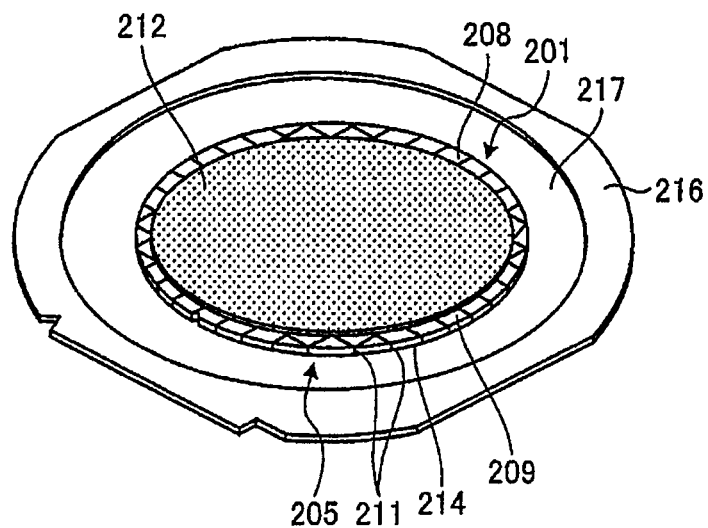
FIG. 11B is a perspective view of the packaged wafer after the peripheral portion removing step in the method of manufacturing the packaged wafer depicted in FIG. 5.

In the next place, a method of manufacturing the packaged wafer 201 for forming the wafer 204 depicted in FIG. 2 into the packaged wafer 201 depicted in FIG. 3 will be described referring to the drawings. FIG. 5 is a flow chart depicting the flow of the method of manufacturing the packaged wafer as the object to be processed by the laser processing apparatus depicted in FIG. 1. FIG. 6A is a sectional view of a major part of a wafer during a groove forming step in the method of manufacturing the packaged wafer depicted in FIG. 5. FIG. 6B is a sectional view of a major part of the wafer after the groove forming step in the method of manufacturing the packaged wafer depicted in FIG. 5. FIG. 6C is a perspective view of the wafer after the groove forming step in the method of manufacturing the packaged wafer depicted in FIG. 5. FIG. 7 is a perspective view of the packaged wafer after a molding resin layer forming step in the method of manufacturing the packaged wafer depicted in FIG. 5. FIG. 8 is a sectional view of a major part of the packaged wafer after the molding resin layer forming step in the method of manufacturing the packaged wafer depicted in FIG. 5. FIG. 9A is a side view depicting a thinning step in the method of manufacturing the packaged wafer depicted in FIG. 5. FIG. 9B is a sectional view of the packaged wafer after the thinning step in the method of manufacturing the packaged wafer depicted in FIG. 5. FIG. 10 is a perspective view depicting a re-attaching step in the method of manufacturing the packaged wafer depicted in FIG. 5. FIG. 11A is a perspective view depicting a peripheral portion removing step in the method of manufacturing the packaged wafer depicted in FIG. 5. FIG. 11B is a perspective view of the packaged wafer after the peripheral portion removing step in the method of manufacturing the packaged wafer depicted in FIG. 5.

As depicted in FIG. 5, the method of manufacturing the packaged wafer 201 according to Embodiment 1 (hereinafter this method will be referred to simply as the manufacturing method) includes a groove forming step ST10, a molding resin layer forming step ST20, a thinning step ST30, a re-attaching step ST40, and a peripheral portion removing step ST50.

The groove forming step ST10 is a step of forming a groove 211 along each division line 202 of the wafer 204 from the front surface 209. In the groove forming step ST10, the groove 211 extending along the longitudinal direction of each division line 202 is formed at each division line 202. The depth of the grooves 211 formed in the groove forming step ST10 is not less than the finished thickness of the packaged wafer 201. In Embodiment 1, in the groove forming step ST10, a back surface 214 on the back side of the wafer 204 is suction held on a holding surface of a chuck table of a cutting apparatus 110, and, by using a cutting blade 113 of cutting means 112 of the cutting apparatus 110 as depicted in FIG. 6A, the grooves 211 are formed in the front surface 209 of the wafer 204, as depicted in FIG. 6B.

In the groove forming step ST10, the chuck table is moved in an X-axis direction parallel to the horizontal direction by X-axis moving means (not depicted), the cutting blade 113 of the cutting means 112 is moved in a Y-axis direction which is parallel to the horizontal direction and is orthogonal to the X-axis direction by Y-axis moving means (not depicted), the cutting blade 113 of the cutting means 112 is moved in a Z-axis direction which is parallel to the vertical direction by Z-axis moving means (not depicted), whereby the groove 211 is formed in the front surface 209 of each division line 202 of the wafer 204, as illustrated in FIG. 6C. Note that in the present invention, in the groove forming step ST10, the grooves 211 may be formed by ablation conducted using a laser beam.

The molding resin layer forming step ST20 is a step of covering the front surface 209 of the device region 207 of the wafer 204 and the grooves 211 with the molding resin 211, as illustrated in FIGS. 7 and 8. In Embodiment 1, in the molding resin layer forming step ST20, the back surface 214 of the wafer 204 is held on a holding table of a resin coating apparatus (not depicted), the front surface 209 of the wafer 204 is covered with a mold, and the molding resin 212 is placed to fill the mold, to cover the whole part of the front surface 209 and the grooves 211 with the molding resin 212. In Embodiment 1, a thermosetting resin is used as the molding resin 212. In the molding resin layer forming step ST20, the molding resin 212 covering the whole part of the front surface 209 of the wafer 204 and the grooves 211 is cured by heating. In addition, while the bumps 210 are exposed when the whole part of the front surface 209 and the grooves 211 are covered with the molding resin 212 in Embodiment 1, the cured molding resin 212 may be subjected to polishing, to securely expose the bumps 210.

The thinning step ST30 is a step of thinning to a finished thickness the substrate 205 of the packaged wafer 201 configured with the wafer 204 covered with the molding resin 212. In the thinning step, as depicted in FIG. 9A, a protective member 215 is attached to the molding resin 212 side of the packaged wafer 201, after which the protective member 215 is suction held on a holding surface 121-1 of a chuck table 121 of a grinding apparatus 120, a grindstone or grindstones 122 are put in contact with the back surface 214 of the packaged wafer 201, and the chuck table 121 and the grindstone or grindstones 122 are rotated about axes, whereby the back surface 214 of the packaged wafer 201 is ground. In the thinning step ST30, as depicted in FIG. 9B, the packaged wafer 201 is thinned until the molding resin 212 filling the grooves 211 is exposed.

The re-attaching step ST40 is a step of peeling the protective member 215 from the packaged wafer 201 and attaching a dicing tape 217 to the packaged wafer 201. In the re-attaching step ST40, as depicted in FIG. 10, the back surface 214 of the packaged wafer 201 is attached to the dicing tape 217, which is accompanied by an annular frame 216 attached to an outer periphery thereof, and the protective member 215 is peeled off the front surface 209 of the packaged wafer 201.

The peripheral portion removing step ST50 is a step of removing the molding resin 212 along a peripheral edge of the packaged wafer 201, and exposing the grooves 211 filled with the molding resin 212 in the peripheral marginal region 208. In Embodiment 1, in the peripheral portion removing step ST50, the molding resin 212 is removed along the whole circumference of the outer peripheral edge of the peripheral marginal region 208 of the packaged wafer 201. In Embodiment 1, in the peripheral portion removing step ST50, like in the groove forming step ST10, as depicted in FIG. 11A, the back surface 214 of the packaged wafer 201 is suction held on the holding surface of a chuck table 111 of the cutting apparatus 110, and, with the chuck table 111 being rotated about an axis parallel to the Z-axis direction by a rotational drive source 114, the cutting blade 115 is made to cut into the molding resin 212 on the outer peripheral edge of the peripheral marginal region 208 until reaching the substrate 205, whereby the grooves 211 filled with the molding resin 212 are exposed on the outer peripheral edge of the peripheral marginal region 208. In the peripheral portion removing step ST50, as depicted in FIG. 11B, the molding resin 212 on the outer peripheral edge of the peripheral marginal region 208 of the packaged wafer 201 is removed. Note that in FIGS. 10, 11A and 11B, the bumps 210 are omitted.

Figure 12:
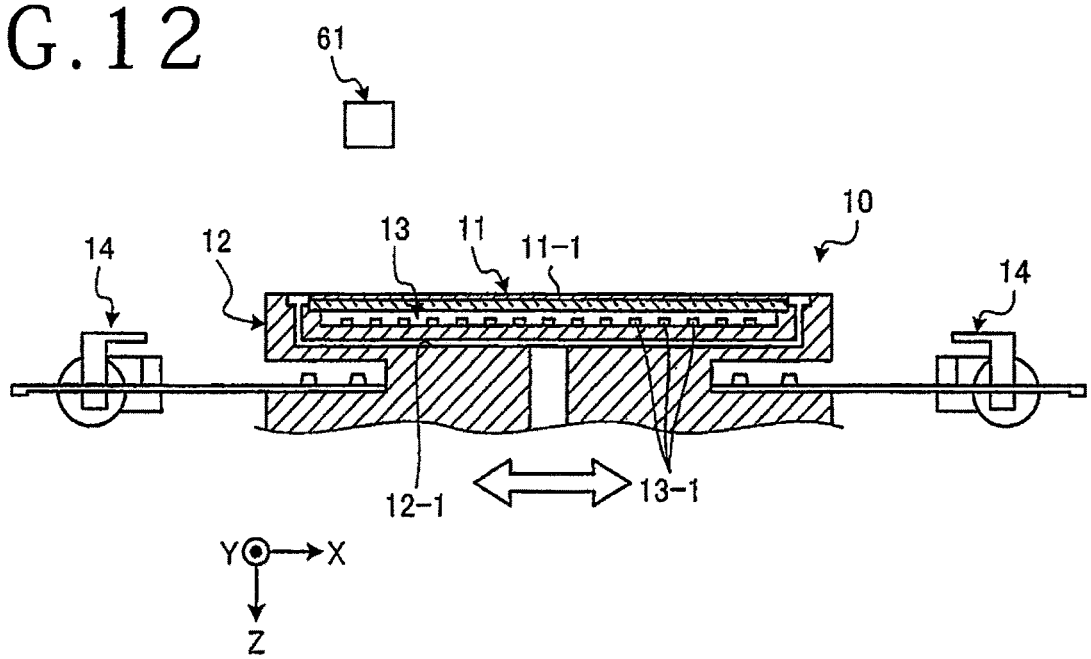
FIG. 12 is a figure depicting the configuration of a chuck table of the laser processing apparatus depicted in FIG. 1.
Figure 13:
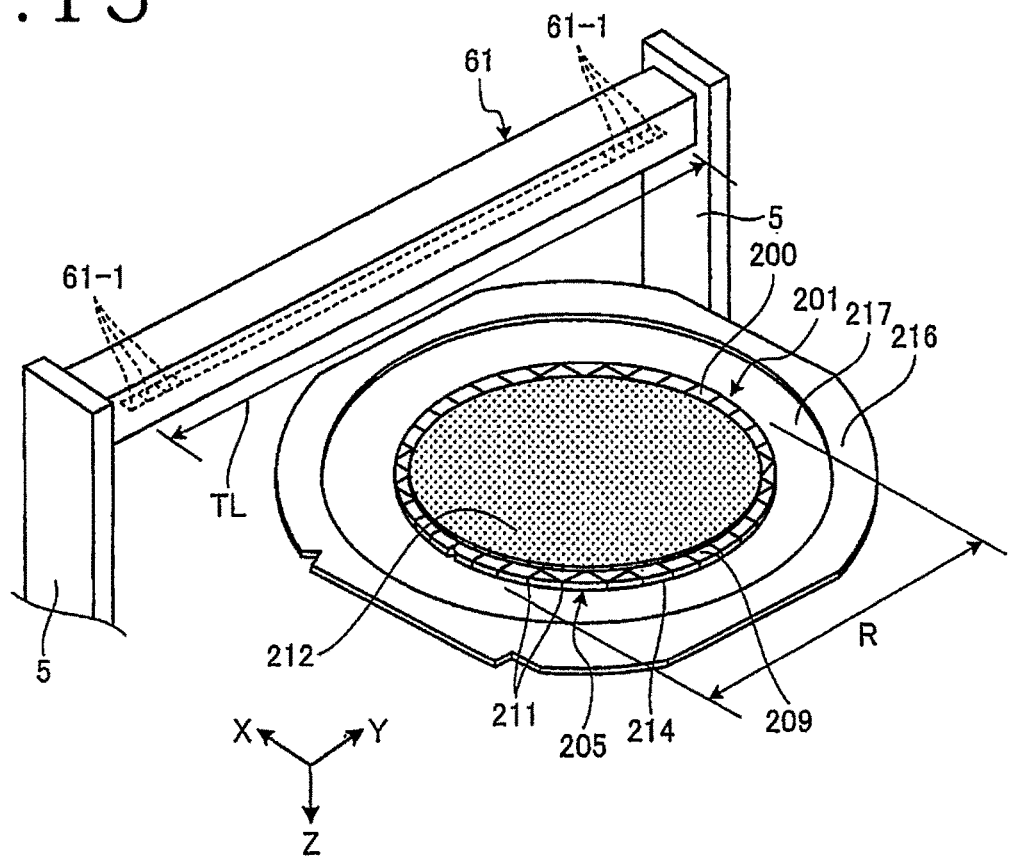
FIG. 13 is a figure depicting a line sensor of an examination unit of the laser processing apparatus depicted in FIG. 1.
Figure 14:
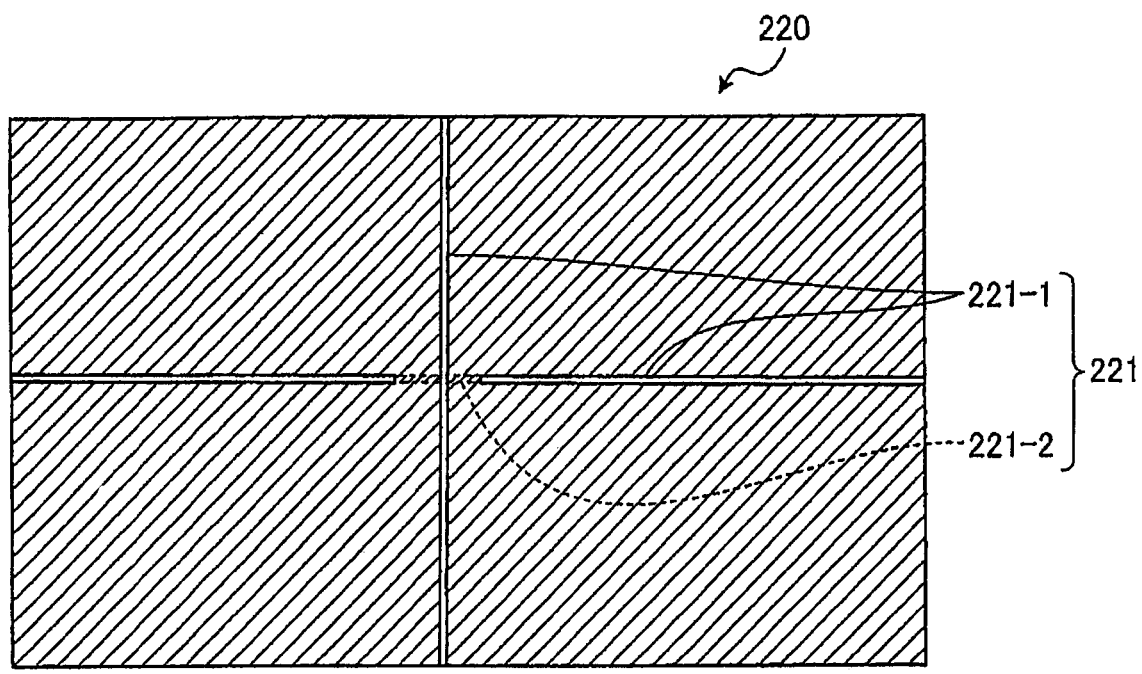
FIG. 14 is a figure depicting a part of a picked-up image generated by a control unit of the examination unit of the laser processing apparatus depicted in FIG. 1.

In the next place, the configuration of the laser processing apparatus 1 according to Embodiment 1 will be described, referring to the drawings. FIG. 12 is a figure depicting the configuration of a chuck table of the laser processing apparatus depicted in FIG. 1. FIG. 13 is a figure depicting a line sensor of an examination unit of the laser processing apparatus depicted in FIG. 1. FIG. 14 is a figure depicting a part of a picked-up image generated by a control unit of the examination unit of the laser processing apparatus depicted in FIG. 1.

The laser processing apparatus 1 is an apparatus for applying a laser beam 218 (depicted in FIG. 3) to the molding resin 212 in the grooves 211 of the packaged wafer 201 to apply ablation to the packaged wafer 201, thereby dividing the packaged wafer 201 into packaged device chips 203. As illustrated in FIG. 1, the laser processing apparatus 1 includes a chuck table 10 that holds the packaged wafer 201 by a holding surface 11-1, a laser processing unit 20, X-axis moving means (X-axis moving unit) 30 which is a processing feeding unit, Y-axis moving means (Y-axis moving unit) 40, an imaging unit 50, and an examination unit 60.

The X-axis moving means 30 is for moving the chuck table 10 in an X-axis direction, or a processing feed direction, parallel to the horizontal direction of an apparatus main body 2, thereby to move the chuck table 10 and the laser processing unit 20 relative to each other in the X-axis direction. The Y-axis moving means 40 is for moving the chuck table 10 in a Y-axis direction, which is parallel to the horizontal direction and is orthogonal to the X-axis direction, to thereby move the chuck table 10 and the laser processing unit 20 relative to each other in the Y-axis direction.

The X-axis moving means 30 and the Y-axis moving means 40 include known ball screws 31 and 41 provided so as to be rotatable about respective axes, known pulse motors 32 and 42 for rotating the ball screws 31 and 41 about the respective axes, and known guide rails 33 and 43 for supporting the chuck table 10 so that the chuck table 10 is movable in the X-axis direction or the Y-axis direction. In addition, the X-axis moving means 30 includes X-axis direction position detection means (not depicted) for detecting the position of the chuck table 10 in the X-axis direction, and the Y-axis moving means 40 includes Y-axis direction position detection means (not depicted) for detecting the position of the chuck table 10 in the Y-axis direction. Each of the X-axis direction position detection means and the Y-axis direction position detection means may be configured by use of a linear scale parallel to the X-axis direction or the Y-axis direction, and a reading head. Each of the X-axis direction position detection means and the Y-axis direction position detection means outputs to a control unit 62 the position of the chuck table 10 in the X-axis direction or the Y-axis direction. Besides, the laser processing apparatus 1 includes a rotational drive source 16 that rotates the chuck table 10 about a center axis parallel to the Z-axis direction, which is orthogonal to both the X-axis direction and the Y-axis direction. The rotational drive source 16 is disposed on a moving table 15 which is moved in the X-axis direction by the X-axis moving means 30.

The laser processing unit 20 is for applying a laser beam 218 toward the front surface 209 of the packaged wafer 201 held on the holding surface 11-1 of the chuck table 10 from above, to apply ablation to the packaged wafer 201, thereby forming through-grooves 219 in the molding resin 212 filling the grooves 211 along division lines 202. The laser beam 218 is a pulsed laser beam having such a wavelength (for example, 355 nm) as to be absorbed in the molding resin 212 placed to fill the grooves 211 of the packaged wafer 201, and having a fixed laser power. The laser processing unit 20 is mounted to a tip of a support column 4 continuous with a wall section 3 erected from the apparatus main body 2. Other than the above-mentioned wavelength, 532 nm or the like may also be used as the wavelength of the laser beam 218; in other words, wavelengths in the range of 200 to 1200 nm such as to be absorbed in the molding resin 212 can be used.

The laser processing unit 20 includes a focusing lens (not depicted) for focusing the laser beam 218 to be applied to the surface of the packaged wafer 201, a driving mechanism (not depicted) for moving a focal point of the laser beam 218 in the Z-axis direction, and a laser beam oscillation unit (not depicted) for oscillating the laser beam 218. The laser beam oscillation unit oscillates the laser beam 218 of a wavelength of 355 nm at a preset repetition frequency. In Embodiment 1, the optical axis of the laser beam 218 applied toward by the front surface 209 of the packaged wafer 201 by the laser processing unit 20 is parallel to the Z-axis direction.

While being moved relative to the packaged wafer 201 held on the chuck table 10 by the X-axis moving means 30 and the Y-axis moving means 40, the laser processing unit 20 applies the laser beam 218 to the molding resin 212 in the groove 211 along each division line 202, to form the through-groove 219 (depicted in FIG. 17) along each division line 202, in the molding resin 212 in the groove 211. The laser processing unit 20 applies the laser beam 218 to the molding resin 212 in the groove 211 along each division line 202 while being moved multiple times relative to the packaged wafer 201 in the X-axis direction.

The imaging unit 50 is for imaging the packaged wafer 201 held by the chuck table 10. The imaging unit 50 is disposed at a position juxtaposed with the laser processing unit 20 in the X-axis direction. In Embodiment 1, the imaging unit 50 is mounted to the tip of the support column 4. The imaging unit 50 is configured using a charge coupled device (CCD) camera that images the packaged wafer 201 held by the chuck table 10.

In addition, the laser processing apparatus 1 includes a cassette 71 in which a plurality of the packaged wafers 201 each supported on an annular frame 216 through a dicing tape 217 are accommodated, and a cassette elevator 70 on which the cassette 71 is placed and which moves the cassette 71 in the Z-axis direction. The laser processing apparatus 1 includes carrying-in/out means (not depicted) that takes out the packaged wafer 201 yet to be subjected to ablation from the cassette 71 and accommodates the packaged wafer 201 having been subjected to ablation into the cassette 71, and a pair of rails 72 for temporary placing of the packaged wafer 201 which has been taken out from the cassette 71 and is yet to be subjected to ablation and the packaged wafer 201 which has been subjected to ablation and is yet to be accommodated into the cassette 71. The laser processing apparatus 1 includes a cleaning unit 90 for cleaning the packaged wafer 201 having been subjected to ablation, and a carrying unit 80 for carrying the packaged wafer 201 between the pair of rails 72 and the chuck table 10 and the cleaning unit 90.

As depicted in FIG. 12, the chuck table 10 includes a transparent or semi-transparent holding member 11 that forms the holding surface 11-1, an annular frame section 12 formed to surround the holding member 11, and a light emitting body 13 disposed on the side of a surface opposite to the holding surface 11-1 of the holding member 11. The holding member 11 is formed in the shape of a circular disk having a thickness of 2 to 5 mm, and is formed, for example, of quartz. The upper surface of the holding member 11 functions as the holding surface 11-1 for holding the packaged wafer 201 thereon.

The annular frame section 12 is composed of a peripheral portion surrounding and supporting the periphery of the holding member 11, and a base portion from which the peripheral portion is erected. As depicted in FIG. 12, the annular frame section 12 has its surface disposed on the same plane as the holding surface 11-1. The annular frame section 12 is attached to the rotational drive source 16. In addition, the annular frame section 12 is provided with a suction passage 12-1 which opens at the outer edge of the holding member 11 and is connected to a vacuum suction source (not depicted).

The light emitting body 13 is attached to the base portion of the annular frame section 12, is disposed to face the lower surface of the holding member 11, and is for illuminating the packaged wafer 201 through the holding member 11. The light emitting body 13 is composed of a plurality of light emitting diodes (LEDs) 13-1. Each of the LEDs 13-1 is connected to a power circuit (not depicted). When electric power is supplied from the power circuit to each LED 13-1, the light emitting body 13 emit light, the light being emitted from the lower surface side to the upper surface side of the holding member 11.

With the annular frame section 12 attached to the rotational drive source 16, the chuck table 10 is movable in the X-axis direction by the X-axis moving means 30, is movable in the Y-axis direction by the Y-axis moving means 40, and is rotatable about an axis by the rotational drive source 16. In addition, the chuck table 10 holds the packaged wafer 201 by suction, through a process in which the packaged wafer 201 held by the annular frame 216 is placed on the holding surface 11-1 through the dicing tape 217, and suction is applied by the vacuum suction source. Besides, clamp sections 14 for clamping the annular frame 216 are provided in the periphery of the chuck table 10.

The examination unit 60 is for examining the through-grooves 219 of the packaged wafer 201 held on the chuck table 10. The examination unit 60 includes a line sensor 61, and a control unit 62 which is a determination section. The line sensor 61 extends along a direction parallel to the holding surface 11-1 which is the plane direction of the holding surface 11-1, in a direction orthogonal to the processing feed direction, which is either the X-axis direction or the Y-axis direction. In Embodiment 1, as depicted in FIG. 13, the line sensor 61 extends in parallel to the Y-axis direction. The line sensor 61 is disposed on a path of movement of the chuck table 10 by the X-axis moving means 30. The line sensor 61 has both ends in the longitudinal direction thereof supported on erect columns 5 erected from the apparatus main body 2, and is disposed on the upper side of the chuck table 10 which is moved between a position near the pair of rails 72 and a position near the laser processing unit 20 by the X-axis moving means 30.

The line sensor 61 includes a plurality of imaging elements 61-1 which face the holding surface 11-1 of the chuck table 10 moved between the position near the pair of rails 72 and the position near the laser processing unit 20 by the X-axis moving means 30 and which image the light coming from the light emitting body 13. The imaging elements 61-1 are aligned in the Y-axis direction. The total length TL of the plurality of imaging elements 61-1 of the line sensor 61 is greater than the outside diameter R of the packaged wafer 20. The line sensor 61 is disposed at such a position that the surface of the packaged wafer 201 held by the chuck table 10 can be imaged by the plurality of imaging elements 61-1. The line sensor 61 outputs an image picked up by each imaging element 61-1, to the control unit 62.

The control unit 62 is for controlling the aforementioned constituent elements of the laser processing apparatus 1, to cause the laser processing apparatus 1 to perform a processing operation on the packaged wafer 201. Note that the control unit 62 is a computer. The control unit 62 is connected to a display apparatus (not depicted) composed of a liquid crystal display or the like for displaying the status of the processing operation, images and the like, and to an input apparatus (not depicted) to be used when the operator registers information on the contents of processing and the like. The input apparatus is composed of at least one of a touch panel, which is provided on a display apparatus, and an external input apparatus such as a keyboard.

The control unit 62 performs alignment for detecting a position of the packaged wafer 201 to which the laser beam 218 is to be applied, prior to ablation. When performing the alignment, the control unit 62 causes the imaging unit 50 to image each of the grooves 211 exposed at the outer peripheral edge of the peripheral marginal region 208 of the packaged wafer 201, and detects the position of the groove 211 formed along each division line 202 to which the laser beam 218 is to be applied, based on the images obtained by the imaging and on the results of detection by the X-axis direction position detection means and the Y-axis direction position detection means.

In addition, the control unit 62 is also for determining the results of processing of the through-grooves 219 through the reception of the light from the light emitting body 13 through the through-grooves 219 by the line sensor 61, after the ablation. After the ablation, in a state in which all the LEDs 13-1 of the light emitting body 13 of the chuck table 10 are turned ON, the control unit 62 causes the chuck table 10 to be moved from the lower side of the laser processing unit 20 toward the pair of rails 72, and causes the chuck table 10 to pass under the line sensor 61. The control unit 62 causes the line sensor 61 to image the whole area of the surface of the packaged wafer 201 which has been formed with the through-holes 219 and is still held on the chuck table 10. Based on the result of detection by the X-axis direction position detection means, the control unit 62 generates a picked-up image 220 a part of which is depicted in FIG. 14 and which represents the surface of the packaged wafer 201, from the results of detection by each imaging element 61-1 of the line sensor 61. The picked-up image 220 represents an image of the whole part, or an area of not smaller than a semi-circle, of the surface of the packaged wafer 201. In other words, the line sensor 61 may image a region of not smaller than a semi-circle, and, after rotation of the chuck table 10 by 180 degrees, may image the remaining region which has not yet been imaged. By this, the laser processing apparatus 1 can increase the degree of freedom as to the position at which to dispose the line sensor 61.

The control unit 62 detects positions 221 (depicted in FIG. 14) of the picked-up image 220 to which the laser beam 218 is to be applied, based on at least the positions to which the laser beam 218 is to be applied and which have been detected by performing alignment. The control unit 62 determines whether the result of processing of the through-groove 219 at each position 221 to which the laser beam 218 is to be applied is good or bad.

When the amount of light from the light emitting body 13 received through the through-groove 219 in regions 221-1 (indicated by a solid white state in FIG. 14), of the positions 221 to which the laser beam 218 is to be applied, is not less than a predetermined light amount, the control unit 62 determines the result of processing in the regions 221-1 to be good. When the amount of light from the light emitting body 13 received through the through-groove 219 in regions 221-2 (indicated by dense parallel slant lines in FIG. 14), of the positions 221 to which the laser beam 218 is to be applied, is less than the predetermined light amount, the control unit 62 determines the result of processing in the regions 221-2 to be bad. In other words, the regions 221-1 are regions where the result of processing of the through-groove 219 is determined to be good, whereas the regions 221-2 are regions where the result of processing of the through-groove 219 is determined to be bad. Note that the predetermined light amount indicates the amount of light which can be received by each imaging element 61-1 of the line sensor 61 when the through-groove 219 has been formed. In addition, in FIG. 14, the regions other than the positions 221 to which the laser beam 218 is to be applied are indicated by coarse parallel slant lines.

Figure 15:
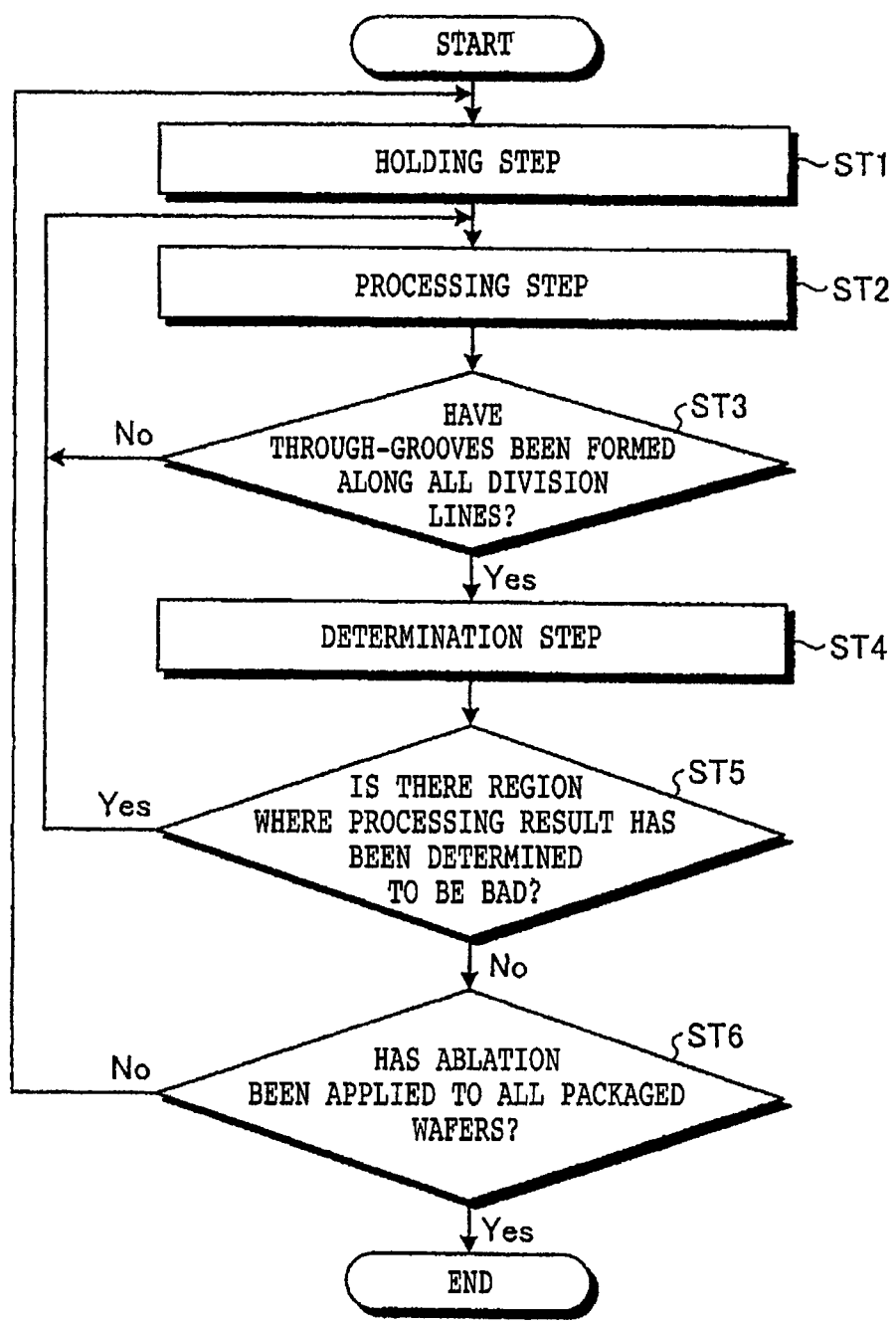
FIG. 15 is a flow chart depicting the flow of a laser processing method using the laser processing apparatus according to Embodiment 1.
Figure 16:
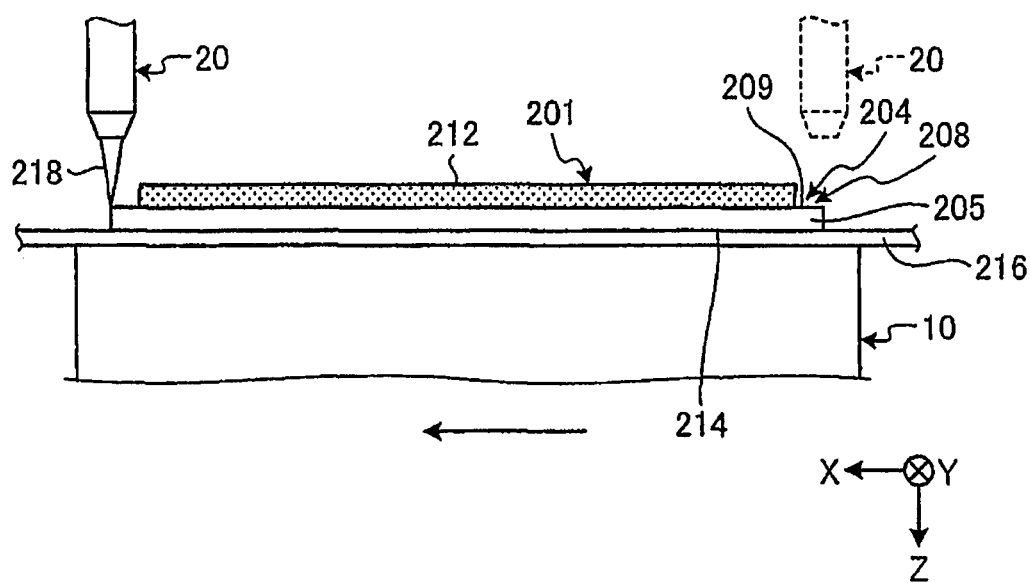
FIG. 16 is a figure depicting a processing step in the laser processing method depicted in FIG. 15.
Figure 17:
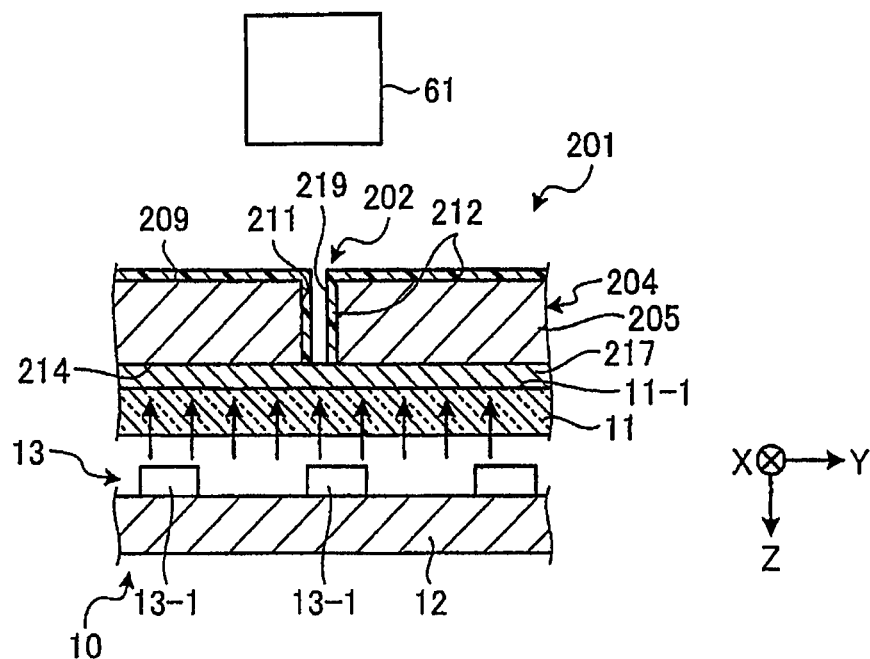
FIG. 17 is a sectional view depicting an example of a through-groove formed by the processing step in the laser processing method depicted in FIG. 15.
Figure 18:
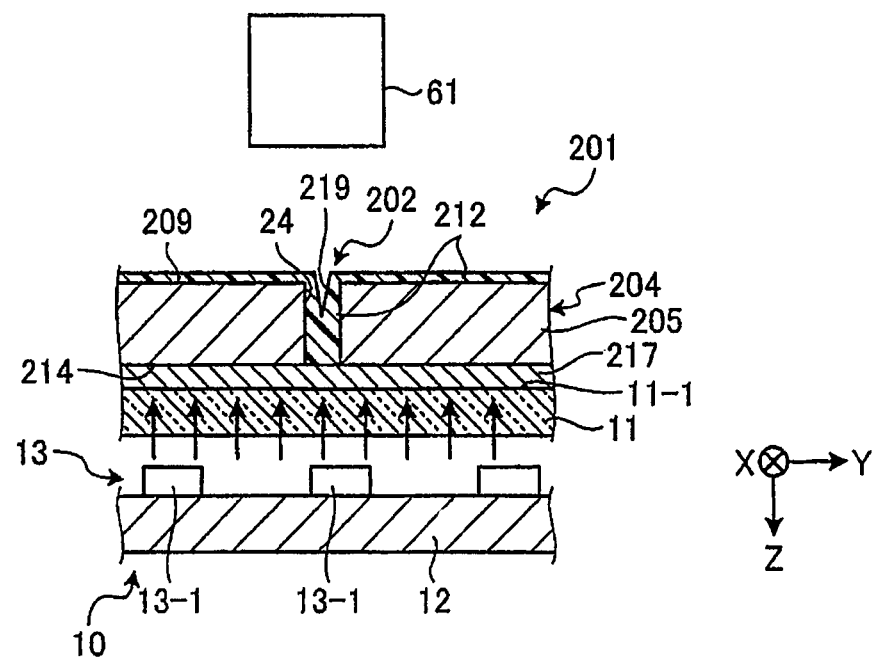
FIG. 18 is a sectional view depicting a region where the result of processing of the through-groove depicted in FIG. 17 is determined to be bad.

In the next place, a laser processing method using the laser processing apparatus 1 will be described below, referring to the drawings. FIG. 15 is a flow chart depicting the flow of the laser processing method using the laser processing apparatus according to Embodiment 1. FIG. 16 is a figure depicting a processing step in the laser processing method depicted in FIG. 15. FIG. 17 is a sectional view depicting an example of a through-groove formed by the processing step in the laser processing method depicted in FIG. 15. FIG. 18 is a sectional view depicting a region where the result of processing of the through-groove depicted in FIG. 17 is determined to be bad.

The laser processing method using the laser processing apparatus 1 (hereinafter referred to as the processing method) is a method of manufacturing the packaged device chips 203 by applying the laser beam 218 to the molding resin 212 filling the grooves 211 of the packaged wafer 201 to divide the molding resin 212 filling the grooves 211. As depicted in FIG. 15, the processing method includes at least a holding step ST1, a processing step ST2, and a determination step ST4.

In the processing method, first, an operator registers information on the contents of processing in a control unit 62 of the laser processing apparatus 1, the operator accommodates the packaged wafers 201 supported on the annular frames 216 in the cassette 71, and the operator places the cassette 71 on the cassette elevator 70 of the laser processing apparatus 1. In the processing method, the laser processing apparatus 1 starts a processing operation when an instruction to start the processing operation is given from the operator.

In the processing method, first, the holding step ST1 is performed. The holding step ST1 is a stop of holding the packaged wafer 201 on the holding surface 11-1 of the holding member 11. In the holding step ST1, the control unit 62 causes the carrying-in/out means to take out one sheet of packaged wafer 201 yet to be subjected to ablation from the cassette 71, and to place the packaged wafer 201 on the pair of rails 72. The control unit 62 causes the carrying unit 80 to place the packaged wafer 201 present on the pair of rails 72 onto the holding surface 11-1 of the holding member 11 of the chuck table 10, and causes the packaged wafer 201 to be suction held on the holding surface 11-1 of the holding member 11 of the chuck table 10. The control unit 62 proceeds to the processing step ST2.

In the processing step ST2, the control unit 62 causes the X-axis moving means 30 and the Y-axis moving means 40 to move the chuck table 10 toward a position under the laser processing unit 20, whereby the packaged wafer 201 held on the chuck table 10 is positioned under the imaging unit 50. In the processing step ST2, the control unit 62 causes the imaging unit 50 to image the groove 211 formed along each division line 202 and exposed in the peripheral marginal region 208 of the packaged wafer 201, and performs alignment of each division line 202.

Then, based on the information on the contents of processing, the control unit 62 causes the X-axis moving means 30 and the Y-axis moving means 40 to face the laser processing unit 20 to an end of that division line 202 of the packaged wafer 201 to which the laser beam 218 is to be applied first, and operates the rotational drive source 16 so that the division line 202 to which the laser beam 218 is to be applied first is set parallel to the X-axis direction. As depicted in FIG. 16, the control unit 62 causes the X-axis moving means to move the chuck table 10 along the X-axis direction a preset number of times, and, while doing so, the control unit 62 causes the laser beam 218 to be applied from the laser processing unit 20. According to the operation of the laser processing apparatus 1, division grooves are formed along the division lines 202 by application of the laser beam 218, and, by performing the laser beam application multiple times, the division grooves can be formed in a greater depth.

When the laser beam 218 has been applied the preset number of times to the division line 202 to which the laser beam 218 is to be applied first, the control unit 62 determines whether or not the through-grooves 219 penetrating to the back surface of the packaged wafer 201 have been formed along all the division lines 202 of the packaged wafer 201 held on the chuck table 10 (step ST3). When it is determined that the through-grooves 219 penetrating to the back surface of the packaged wafer 201 have not yet been formed along all the division lines 202 of the packaged wafer 201 held on the chuck table 10 (step ST3: No), the control unit 62 returns to the processing step ST2, and repeats the processing step ST2, to apply the laser beam 218 to the molding resin 212 filling the groove 211 along the next division line 202.

When it is determined that the through-grooves 219 penetrating to the back surface of the packaged wafer 201 have been formed along all the division lines 202 of the packaged wafer 201 held on the chuck table 10 (step ST3: Yes), the control unit 62 proceeds to the determination step ST4. The determination step ST4 is a step in which the light emitting body 13 is made to emit light, the packaged wafer 201 having been formed with the through-grooves 219 in the molding resin 212 filling the grooves 211 by application of the laser beam 218 is moved in the X-axis direction, and the light from the light emitting body 13 is received through the through-grooves 219 by the line sensor 61 parallel to the Y-axis direction, to thereby determine the results of processing of the through-grooves 219.

In the determination step ST4, the control unit 62 causes the light emitting body 13 to emit light, and causes the chuck table 10 to be moved from a position under the laser processing unit 20 onto the pair of rails 72, and to pass under the line sensor 61. In the determination step ST4, the control unit 62 generates the picked-up image 220 depicted in FIG. 14 from the image picked up by each imaging element 61-1 of the line sensor 61, based on the result of detection by the X-axis direction position detection means.

In the determination step ST4, the control unit 62 determines whether or not there is a region 221-2 where the light amount at the positions 221 in the picked-up image 220 which have been determined to be irradiated with the laser beam 218 at the time of alignment is less than the predetermined amount. In the determination step ST4, in the regions 221-1 which are indicated by a solid white state in FIG. 14 and in which the light amount has been determined by the control unit 62 to be not less than the predetermined amount, the through-groove 219 has been formed to penetrate the molding resin 212 filling the groove 211 of the packaged wafer 201, as depicted in FIG. 17, so that the light from the light emitting body 13 is received by the imaging unit 50 through the holding member 11 and the through-groove 219. In addition, in the determination step ST4, in the regions 221-2 which are indicated by dense parallel slant lines in FIG. 14 and in which the light amount has been determined by the control unit 62 to be less than the predetermined light amount, at the positions 221 to be irradiated with the laser beam 218, the through-groove 219 does not penetrate the molding resin 212 filling the groove 211 of the packaged wafer 201, and the molding resin 212 remains at the bottom of the through-groove 219, as depicted in FIG. 18, so that the light from the light emitting body 13 is not received by the imaging unit 50. Note that in FIGS. 17 and 18, the bumps 210 are omitted.

In the determination step ST4, when it is determined that a region 221-2 where the light amount is less than the predetermined light amount is present among the positions in the picked-up image 220 which have been detected to be irradiated with the laser beam 218 at the time of alignment, the control unit 62 detects the position of the region 221-2 where the light amount is less than the predetermined light amount, and temporarily stores the thus detected position as a region 221-2 where the result of processing of the through-groove 219 has been determined to be bad. Then, the control unit 62 determines whether or not there is a region 221-2 where the result of processing of the through-groove 219 has been determined in the determination step ST4 to be bad (step ST5). When it is determined that there is a region 221-2 where the result of processing of the through-groove 219 has been determined in the determination step ST4 to be bad (step ST5: Yes), the control unit ST2 returns to the processing step ST2, and repeats the steps ranging from the processing step ST2 to the determination step ST4. In the processing step ST2 upon returning from the step ST5, the control unit 62 causes the chuck table 10 to be moved toward a position under the laser processing unit 20, and causes the laser beam 218 to be again applied to the molding resin 212 of the packaged wafer 201 filling the groove 211 in the region 221-2 where the result of processing of the through-groove 219 has been determined to be bad, to thereby perform formation of the through-groove 219 in the molding resin 212. In other words, in the case where the result of processing of the through-groove 219 is determined to be bad in the determination step ST4, the control unit 62 causes the laser beam 218 to be applied to the package wafer 201 in the region 221-2 where the result of processing has been determined to be bad, thereby performing the processing.

When it is determined that there is no region 221-2 where the result of processing of the through-groove 219 has been determined in the determination step ST4 to be bad (step ST5: No), the control unit 62 causes the chuck table 10 to be stopped at a position near the pair of rails 72, turns OFF the light emitting body 13, and releases the suction holding of the chuck table 10. Then, the control unit 62 causes the packaged wafer 201 having undergone ablation to be carried to the cleaning unit 90 by use of the carrying unit 80, causes the cleaning unit 90 to clean the packaged wafer 201, and accommodates the cleaned packaged wafer 201 into the cassette 71.

The control unit 62 determines whether or not all the packaged wafers 201 in the cassette 71 have been subjected to ablation (step ST6). When it is determined that all the packaged wafers 201 in the cassette 71 have not yet been subjected to ablation (step ST6: No), the control unit 62 returns to the holding step ST1, places the packaged wafer 201 yet to be subjected to ablation on the chuck table 10 again, and repeats the steps ranging from the holding step ST1 to the step ST5, to thereby divide all the packaged wafers 201 in the cassette 71 into individual packaged device chips 203. When it is determined that all the packaged wafers 201 in the cassette 71 have been subjected to ablation (step ST6: Yes), the control unit 62 finishes the processing operation.

The aforementioned control unit 62 includes an arithmetic operation apparatus having a microprocessor such as a central processing unit (CPU), a storage apparatus having a memory such as a read only memory (ROM) or a random access memory (RAM), and an input/output interface. The arithmetic operation apparatus of the control unit 62 performs arithmetic operations according to a computer program stored in the storage apparatus, and outputs control signals for controlling the laser processing apparatus 1 to the aforementioned constituent elements of the laser processing apparatus 1 through the input/output interface. In addition, the function of the control unit 62 is realized through execution of the computer program stored in the storage apparatus by the arithmetic operation apparatus and storage of necessary information in the storage apparatus.

In the laser processing apparatus 1 according to Embodiment 1, the line sensor 61 is disposed on the path of movement of the chuck table 10. Therefore, by causing the chuck table 10 to pass under the line sensor 61 while causing the light emitting body 13 of the chuck table 10 to emit light after the ablation, the whole area of the surface of the packaged wafer 201 can be imaged. Accordingly, based on whether or not the light from the chuck table 10 is detected in the picked-up image 220, the laser processing apparatus 1 can determine the results of processing of the through-grooves 219.

In addition, the laser processing apparatus 1 applies the laser beam 218 again to the molding resin 212 filling the groove 211 where the result of processing of the through-groove 219 has been determined to be bad. As a result, the laser processing apparatus 1 can properly form the through-grooves 219 along all the division lines 202 of the packaged wafer 201.

In addition, in the laser processing apparatus 1, the line sensor 61 is disposed on the path of movement of the chuck table 10. Therefore, the packaged wafer 201 in the state of being held on the chuck table 10 can be imaged by the line sensor 61, and the laser beam 218 is applied again to the molding resin 212 filling the groove 211 where the result of processing of the through-groove 219 has been determined to be bad. Ordinarily, when a packaged wafer 201 having been divided at through-grooves 219 into packaged device chips 203 is detached from the chuck table 10, the packaged device chips 203 would move and the division lines 202 would become non-straight lines, making it difficult to apply the laser beam 218 while performing the processing feeding again. On the other hand, the laser processing apparatus 1 can apply ablation to the grooves 211 where the through-grooves 219 have not been formed properly, without detaching the packaged wafer 201 from the chuck table 10. Accordingly, the laser processing apparatus 1 has an effect that the through-grooves 219 can be properly formed along all the division lines 202 of the packaged wafer 201.

In addition, in the laser processing apparatus 1, the line sensor 61 is disposed in parallel to the Y-axis direction orthogonal to the X-axis direction which is the processing feed direction of the chuck table 10. Therefore, by causing the chuck table 10 to pass under the line sensor 61 once, it is possible to image the whole area of the surface of the packaged wafer 201. For this reason, even when it is determined whether or not the through-grooves 219 have been formed, the time required for processing can be restrained from being prolonged.

Embodiment 2

Figure 19:
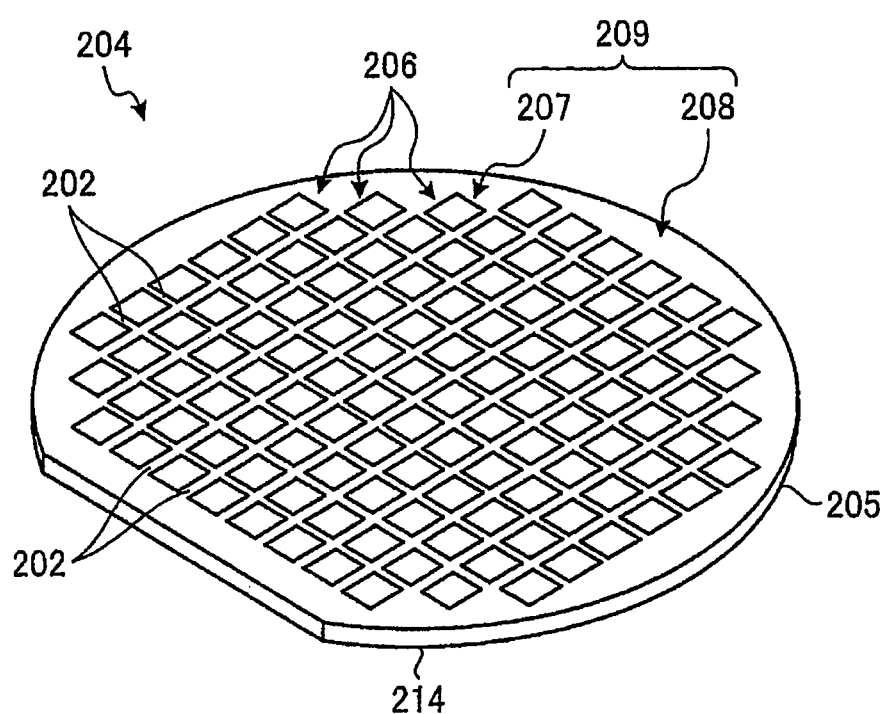
FIG. 19 is a perspective view of a wafer as an object to be processed by a laser processing apparatus according to Embodiment 2.

A laser processing apparatus according to Embodiment 2 will be described. FIG. 19 is a perspective view of a wafer as an object to be processed by the laser processing apparatus according to Embodiment 2. In FIG. 19, the same sections as those in Embodiment 1 above are denoted by the same reference symbols as used above, and descriptions thereof are omitted.

The laser processing apparatus 1 according to Embodiment 2, for which an object to be processed is the wafer 204 as the workpiece depicted in FIG. 19, is the same as that in Embodiment 1 in the configuration of the apparatus itself. In a laser processing method using the laser processing apparatus 1 according to Embodiment 2, the wafer 204 is one formed with a low-dielectric-constant insulating material film (low-k film) on a front surface 209 thereof, or one in which the devices 206 are each an imaging element such as complementary metal-oxide-semiconductor (CMOS). The low-dielectric-constant insulating material film is composed of an inorganic material film of SiOF or BSG (SiOB) or the like and an organic material film which is a polymer film based on polyimide or parylene or the like. The front surface 209 of the wafer 204 is attached to a dicing tape 217, which is accompanied by an annular frame 216 attached to an outer periphery thereof. The wafer 204 is cut along division lines 202 from the back surface 214 side, to form cut grooves, leaving a cutting allowance of a predetermined thickness on the front surface 209 side. The wafers 204 in the state of having been thus formed with the cut grooves are accommodated in the cassette 71. During when each of the wafers 204 is moved once by X-axis moving means 30, the cutting allowance is cut by a laser processing unit 20, to form through-grooves 219.

The laser processing apparatus 1 according to Embodiment 2, like that in Embodiment 1, has a line sensor 61 disposed on the path of movement of the chuck table 10, so that by causing the chuck table 10 to pass under the line sensor 61 while causing the light emitting body 13 of the chuck table 10 to emit light after the ablation, the whole area of the surface of the packaged wafer 201 can be imaged. Accordingly, the laser processing apparatus 1 has an effect that the through-grooves 219 can be properly formed along all the division lines 202 of the packaged wafer 201.

Note that according to the laser processing apparatuses according to Embodiment 1 and Embodiment 2, the following laser processing methods and the following methods of manufacturing a packaged device chip can be obtained.

(Appendix 1)

A laser processing method comprising:
a holding step of holding a workpiece on a holding surface of a transparent or semi-transparent holding member; and
a determination step of moving the workpiece, formed with through-grooves in processed regions by application of a laser beam, in a processing feed direction parallel to the holding surface while causing a light emitting body disposed on the side of a surface opposite to the holding surface of the holding member to emit light, and receiving the light from the light emitting body by a line sensor orthogonal to the processing feed direction through the through-grooves, to thereby determine a result of processing.

(Appendix 2)

The laser processing method according to appendix 1, wherein, when the result of processing of the through-groove is determined to be bad in the determination step, the laser beam is applied to the workpiece in a region where the processing result is determined to be bad, to process the workpiece in the region.

(Appendix 3)

A method of manufacturing a packaged device chip for dividing processed regions of a packaged wafer in which a molding resin is placed to cover an upper side of devices provided on a front surface and to fill the processed regions between the devices, thereby manufacturing packaged device chips in each of which the upper side and all side surfaces of the device are covered with the molding resin, the method comprising:
a holding step of holding a back surface side of the packaged wafer on a holding surface of a transparent or semi-transparent holding member; and
a determination step of moving the packaged wafer, formed with through-grooves in the processed regions by application of a laser beam, in a processing feed direction parallel to the holding surface while causing a light emitting body disposed on the side of a surface opposite to the holding surface of the holding member to emit light, and receiving the light from the light emitting body by a line sensor orthogonal to the processing feed direction through the through-grooves, to thereby determine a result of processing.

(Appendix 4)

The method of manufacturing the packaged wafer chip according to appendix 3, wherein, when the result of processing of the through-groove is determined to be bad in the determination step, the laser beam is applied to the workpiece in a region where the processing result is determined to be bad, to thereby process the workpiece in the region.

Note that the present invention is not limited to the above described embodiments. The present invention can be carried out with various modifications made without departing from the gist of the invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:
1. A laser processing apparatus comprising:
a chuck table that holds a workpiece by a holding surface, the workpiece having a groove formed along each of a plurality of division lines and a resin layer formed inside each of the grooves;
a laser processing unit that applies a laser beam of such a wavelength as to be absorbed in the resin layer formed within the grooves of the workpiece held by the chuck table, to form a through-groove in each of the resin layers formed within each of the grooves;

a processing feeding unit that moves the chuck table in a processing feed direction parallel to the holding surface; and an examination unit that examines the through-grooves of the workpiece held by the chuck table, wherein the chuck table includes
- a transparent or semi-transparent holding member that forms the holding surface, and
- a light emitting body that illuminates the workpiece through the holding member on the side of a surface opposite to the holding surface of the holding member;

the examination unit includes
- a line sensor that extends along a surface direction of the holding surface in a direction orthogonal to the processing feed direction, faces the holding surface and receives light from the light emitting body, and
- a determination section that determines a result of processing through reception by the line sensor of the light from the light emitting body through the through-grooves formed within the resin layer; and wherein the line sensor images a whole surface of the workpiece having been formed with the through-grooves and being held by the chuck table.

2. The laser processing apparatus according to claim 1, wherein when it is determined by the determination section that the result of processing of the through-groove is bad, the laser beam is applied to the workpiece in a region where the processing result is determined to be bad, to process the workpiece in the region.

* * * * *